United States Patent [19]
Good et al.

[11] Patent Number: 5,369,319
[45] Date of Patent: Nov. 29, 1994

[54] COMPARATOR HAVING TEMPERATURE AND PROCESS COMPENSATED HYSTERESIS CHARACTERISTIC

[75] Inventors: Brian K. Good, Greentown; Gregory J. Manlove, Kokomo; Edward H. Honnigford, Russiaville, all of Ind.

[73] Assignee: Delco Electronics Corporation, Kokomo, Ind.

[21] Appl. No.: 992,306

[22] Filed: Dec. 21, 1992

[51] Int. Cl.⁵ .............................................. H03K 5/22
[52] U.S. Cl. .................................. 327/73; 327/513; 327/77; 327/206
[58] Field of Search ............... 307/494, 354, 355, 231, 307/290, 362, 310, 491, 296.6, 296.8, 296.1

[56] References Cited

U.S. PATENT DOCUMENTS

| | | | |
|---|---|---|---|
| 4,394,587 | 7/1983 | McKenize et al. | 307/359 |
| 4,521,697 | 6/1985 | Joseph | 307/491 |
| 4,617,481 | 10/1986 | Masuda | 307/491 |
| 4,730,126 | 3/1988 | Chen | 307/290 |
| 4,733,107 | 3/1988 | O'Shaughnessy | 307/354 |
| 4,749,955 | 6/1988 | Cook | 330/253 |
| 4,835,417 | 5/1989 | Kousaka et al. | 307/362 |
| 4,874,969 | 10/1989 | Meadows | 307/494 |
| 4,902,913 | 2/1990 | Hein et al. | 307/491 |
| 4,940,907 | 7/1990 | Laude | 307/362 |
| 5,013,934 | 5/1991 | Hobrecht et al. | 307/296.7 |
| 5,043,599 | 8/1991 | Zitta | 307/362 |
| 5,057,716 | 10/1991 | Kiing | 307/491 |
| 5,061,862 | 10/1991 | Tamagawa | 307/491 |
| 5,087,830 | 2/1992 | Cave et al. | 307/491 |
| 5,105,101 | 4/1992 | Hinooka | 307/491 |
| 5,121,004 | 6/1992 | Kesler et al. | 307/454 |
| 5,122,680 | 6/1992 | Stakely et al. | 307/354 |
| 5,136,184 | 8/1992 | Deevy | 307/494 |
| 5,268,872 | 12/1993 | Fujii et al. | 307/362 |

OTHER PUBLICATIONS

"CMOS Analog Circuit Design" by Phillip E. Allen and Douglas R. Holberg, Hold, Rinehart and Winston, pp. 349–357.

"A Precision Variable–Supply CMOS Comparator" by David J. Allstot, 1982 IEEE, pp. 1080–1087.

*Primary Examiner*—Timothy P. Callahan
*Assistant Examiner*—T. T. Lam
*Attorney, Agent, or Firm*—Mark A. Navarre; Jimmy L. Funke

[57] ABSTRACT

A MOS hysteresis comparator having a source transistor bias circuit which generates a source current Is that compensates for temperature and manufacturing process variations, thereby providing a hysteresis characteristic which is substantially insensitive to such temperature and manufacturing process variations. The source transistor bias circuit includes a set of MOS transistors which replicate the comparator load currents which occur at the switch points of the comparator, and a source transistor which mirrors the sum of the replicated currents to form the source current Is of the comparator.

10 Claims, 4 Drawing Sheets

COMPARATOR HAVING TEMPERATURE AND PROCESS COMPENSATED HYSTERESIS CHARACTERISTIC

This invention relates to a metal oxide semiconductor (MOS) hysteresis comparator, and more particularly, to a MOS comparator circuit having a hysteresis characteristic which is substantially unaffected by variations in temperature and manufacturing process.

BACKGROUND OF THE INVENTION

Comparators are commonly employed for threshold detection applications where the output of the comparator changes state depending on whether a variable input voltage is above or below a reference voltage. For example, a comparator can be used as a zero crossing detector to provide a logic level digital output signal based on an AC input voltage developed by a magnetic variable reluctance speed sensor.

In applications where electrical noise is superimposed on an input signal, the comparator may change states based on the noise content of the input signal when the input voltage approaches the switch point of the comparator. To desensitize the comparator to such noise, the comparator circuit is designed with a hysteresis characteristic which effectively increases or decreases the reference voltage, depending on the output state of the comparator.

A conventional technique for providing hysteresis with resistive feedback in a discrete circuit mechanization is depicted in FIG. 2. The comparator 10 is connected between a regulated source voltage $+V$ and ground potential, as shown. The input voltage Vin is applied via line 12 to the inverting $(-)$ comparator input, the reference voltage Vref is applied via line 14 and resistor R1 to the non-inverting $(+)$ comparator input, and the output signal Vout is developed on line 16. The resistors R1, R2 and R3 form a divider network that differentially alters the threshold voltage Vth at the $(+)$ input of the comparator, depending on the state of the output signal Vout. When the output signal Vout is high $(+V)$, a feedback current through resistors R2 and R3 increases the threshold voltage Vth. When the output signal Vout is low (ground potential), the resistor R3 is effectively connected in parallel with resistor R2, thereby lowering the threshold voltage Vth.

The theoretical effect of the above-described feedback is graphically depicted in FIG. 1, which depicts the output signal Vout as a function of the input voltage Vin. As Vin is increased from a relatively low value, the output signal Vout remains high $(+V)$ until the input voltage exceeds the reference voltage Vref by a hysteresis voltage Vhyst. At such point, as designated by (Vref+Vhyst), the output signal Vout transitions to its low state (0). As the input voltage is subsequently reduced, the output signal Vout remains low until the input voltage falls below the reference voltage Vref by the hysteresis voltage Vhyst. At such point, as designated by (Vref−Vhyst), the output signal Vout transitions to its high state $(+V)$.

Although commonly used in nondemanding applications, the above-described circuit cannot meet precise performance specifications in applications requiring a ground reference, such as in zero crossing detection. Unless a bi-polar voltage supply is used, the designer is faced with a trade-off between asymmetric hysteresis and overly restrictive signal range limitations.

In a MOS comparator, hysteresis may be achieved with the circuit depicted in FIG. 3. The basic comparator is defined by a current source transistor Qs feeding a pair of coupled differential transistors Q5, Q6, each of which is connected in series with a load transistor Q1, Q4. The current path dimensions (width W and length L) of the differential transistors Q5 and Q6 are matched, as are the current path dimensions of the load transistors Q1 and Q4.

The input voltage Vin is applied to the gate of differential transistor Q5 and the reference voltage Vref is applied to the gate of differential transistor Q6. A bias voltage Vbias is applied to the gate of source transistor Qs to maintain the source current Is at a constant value, and the source current Is is variably divided between the first and second differential transistors Q5 and Q6 depending on the relative magnitudes of Vin and Vref. An output stage comprising the transistors Q7–Q10 is connected to the first and second comparator legs at junctions 20 and 22 as shown, developing an inverted output voltage Vout* on line 24.

When the input voltage Vin is much less than the reference voltage Vref, the preferred path for the source current Is is through transistors Q5 and Q1, turning on output stage transistors Q9, Q7 and Q8. The output stage transistor Q10 is off, or nearly so, due to the lack of current flow in the second comparator leg, and Vout* is substantially equal to $+V$. This condition prevails until the input voltage Vin increases beyond the reference voltage Vref, whereupon the preferred path for the source current Is is through the transistors Q6 and Q4, turning on output stage transistor Q10. The output stage transistors Q7, Q8 and Q9 are off, or nearly so, due to the lack of current flow in the first comparator leg, and Vout* is maintained substantially at ground potential.

Hysteresis in the switch point of the MOS comparator circuit is provided by the additional MOS transistors Q2 and Q3, referred to herein as hysteresis transistors. The current path dimensions of the hysteresis transistors Q2 and Q3 are matched, and higher in overall transconductance than the matched load transistors Q1 and Q4. Algebraically, this may be expressed as:

$$W1/L1 < W2/L2,\ W1/L1 = W4/L4\ \text{and}$$
$$W2/L2 = W3/L3$$

The hysteresis transistors Q2 and Q3 are cross-coupled between the first and second comparator legs, and effectively shift the switch point of the comparator above and below the reference voltage Vref to achieve a hysteresis characteristic as illustrated by the idealized trace of FIG. 1.

When the input voltage Vin is much less than the reference voltage Vref, and the preferred path for the source current Is is through transistors Q5 and Q1, the hysteresis transistor Q2 is also gated on. In this condition, transistor Q2 attempts to conduct current in proportion to the current I1 through transistor Q1. This current, referred to as the hysteresis current I2(h), can be expressed as:

$$I2(h) = I1 \cdot [(W2/L2)/(W1/L1)]$$

where I1 is the current through load transistor Q1, W2 and L2 represent the current path width and length dimensions of hysteresis transistor Q2, and W1 and L1 represent the current path width and length dimensions of load transistor Q1. When Vin is significantly less than Vref, the current I2 through hysteresis transistor Q2 is much less than the hysteresis current I2(h).

As the input voltage increases, some of the source current Is flows through transistors Q6 and Q2, but the comparator only switches state when such current increases beyond the hysteresis current I2(h). Due to the current shunting operation of hysteresis transistor Q2—taking current away from load transistor Q4—the input voltage Vin at the switching point of the comparator is greater than the reference voltage Vref. As indicated above, the amount by which the input voltage Vin exceeds the reference voltage Vref at the switch point of the comparator is designated as the hysteresis voltage Vhyst.

As soon as the current through differential transistor Q6 exceeds the hysteresis current I2(h), transistors Q4 and Q3 are biased on, and transistors Q1 and Q2 are biased off. The circuit is now in positive feedback; consequently, the output voltage Vout* switches to substantially ground potential. In this state, hysteresis transistor Q3 attempts to conduct current in proportion to the current I4 through load transistor Q4. This current, referred to as the hysteresis current I3(h), can be expressed as:

$$I3(h) = I4 \cdot [(W3/L3)/(W4/L4)]$$

where I4 is the current through load transistor Q4, W3 and L3 represent the current path width and length dimensions of hysteresis transistor Q3, and W4 and L4 represent the current path width and length dimensions of load transistor Q4. Now, hysteresis transistor Q3 is shunting current away from load transistor Q1, as described above with respect to hysteresis transistor Q2. In this case, the input voltage Vin must fall below the reference voltage Vref by at least Vhyst before the comparator can switch back to its former state. Since hysteresis transistors Q2 and Q3 are dimensionally matched, the hysteresis voltages Vhyst above and below the reference voltage Vref are equal, as illustrated by the idealized trace of FIG. 1.

The magnitude of the hysteresis voltage Vhyst can thus be viewed as the difference between Vin and Vref at either switch point of the comparator. In MOS terminology, these voltages are designated as Von(5) for transistor Q5, and Von(6) for transistor Q6. Due to the coupling of differential transistors Q5 and Q6, the hysteresis voltage Vhyst may be defined as:

$$Vhyst = Von(5) - Von(6), \text{ or } Vhyst = \Delta Von$$

The Von terms, in turn, may be defined in terms of the respective currents I5 and I6 at the switch point of the comparator, the respective transistor gain constants K5 and K6, and the respective current path dimensions W5,L5 and W6,L6. The expressions for Von(5), Von(6) and Vhyst are as follows:

$$Von(5) = [(I5 \cdot L5)/(K5 \cdot W5)]^{\frac{1}{2}},$$

$$Von(6) = [(I6 \cdot L6)/(K6 \cdot W6)]^{\frac{1}{2}}, \text{ and}$$

$$Vhyst = [(I5 \cdot L5)/(K5 \cdot W5)]^{\frac{1}{2}} - [(I6 \cdot L6)/(K6 \cdot W6)]^{\frac{1}{2}}.$$

The significance of these relationships with respect to the present invention is that the gain constants K5, K6, and hence the hysteresis voltage Vhyst, are subject to variation with temperature and manufacturing process. Typically, the gain factors tend to increase nonlinearly with temperature. Variability in the manufacturing process—control of dimensions and material thickness, for example—produces circuit-to-circuit hysteresis variability. In certain applications, this may be acceptable, but in others, it is not. In applications subject to wide variation in temperature, for example, variations of 50%-75% are typically observed.

It is known, in theory, that the hysteresis variations may be mitigated by suitable adjustment of the source current Is. This may be seen in the above expression for Vhyst; for example, if K5 increases, I5 must correspondingly increase. However, known circuits for achieving the source current variation have only been marginally successful.

An example of a known compensation circuit of the type referred to above is depicted in FIG. 4. As in FIG. 3, the source current device is identified as transistor Qs. Bias transistors Q11 and Q12 are connected in series. A bias voltage Vbias developed at the junction of transistors Q11 and Q12 is applied to the gate of each transistor. The theory of operation is that the temperature and/or process variations which affect the differential transistors Q5 and Q6 of the comparator will similarly affect transistor Q11, that the corresponding variation in its gate-to-source voltage Vgs(11) will produce a compensating change in the current I11, and that a corresponding source current Is will be mirrored through the source transistor Qs.

The primary problem with this approach is that the source current Is is also influenced by the gate-to-source voltage Vgs(12) of transistor Q12 and the threshold voltage Vt(11) of transistor Q11. As a result, the source current Is developed in this manner does not sufficiently compensate for variation in the operating parameters of the differential transistors Q5 and Q6, and significant variation in the hysteresis voltage Vhyst can still occur.

SUMMARY OF THE PRESENT INVENTION

The present invention is directed to an improved MOS hysteresis comparator having a source transistor bias circuit which generates a source current Is that compensates for temperature and manufacturing process variations, thereby providing a hysteresis characteristic which is substantially insensitive to such temperature and manufacturing process variations.

The source transistor bias circuit comprises a set of MOS transistors which replicate the comparator load currents which occur at the switch points of the comparator, and a source transistor which mirrors the sum of the replicated currents to form the source current Is of the comparator.

The load currents are replicated in a set of four transistors corresponding to comparator transistors which are active at the switch points of the comparator. A voltage source corresponding to the desired hysteresis voltage maintains the proper ΔVon between two transistors corresponding to the comparator differential transistors, and an operational amplifier biases the remaining two transistors to replicate the coupling between the comparator differential transistors. Consequently, the bias circuit currents replicate the comparator load currents which would occur with a constant desired hysteresis voltage, and the source current Is is varied to ensure that the comparator exhibits a substantially constant hysteresis voltage despite variation in the transistor performance characteristics due to temperature and manufacturing process variability.

DETAILED DESCRIPTION OF THE INVENTION

Figure 4:
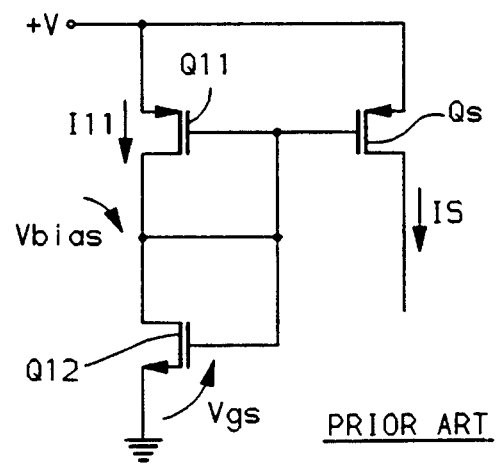
FIG. 4 is a prior art circuit for compensating the source current of the comparator of FIG. 3.
Figure 5:
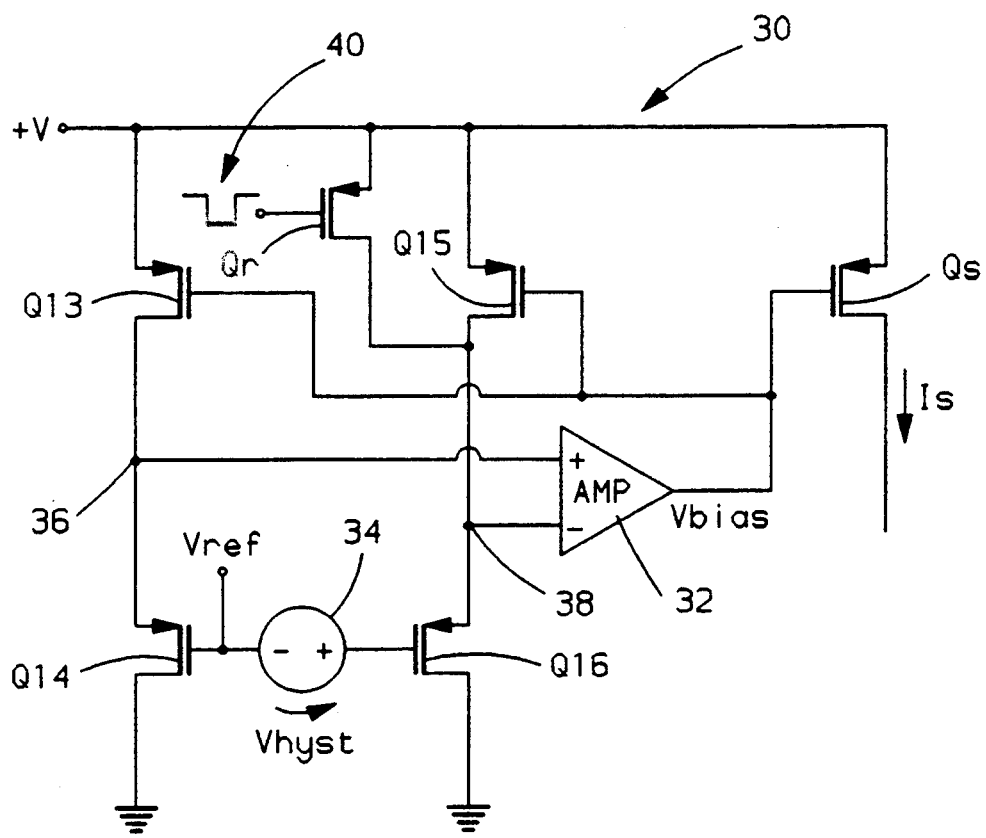
FIG. 5 is a schematic diagram of a source transistor bias circuit according to this invention for compensating the source current of the comparator of FIG. 3 for temperature and manufacturing process variations.

Referring to FIG. 5, the reference numeral 30 generally designates a source transistor bias circuit according to this invention. The transistor providing the source current Is is identified as source transistor Qs, as in FIGS. 3 and 4, discussed above. The bias circuit 30 includes a set of four MOS transistors Q13, Q14, Q15 and Q16 that replicate the currents in the first and second legs of the comparator circuit at the switch point of the comparator, and a feedback amplifier 32 for adjusting the replicated currents as required to ensure that the replicated currents satisfy the switch point condition over temperature and manufacturing process variations. As explained below, the source transistor Qs is biased to mirror the sum of the replicated currents, thereby providing the comparator with the proper source current Is for maintaining a substantially constant hysteresis voltage Vhyst.

Figure 1:
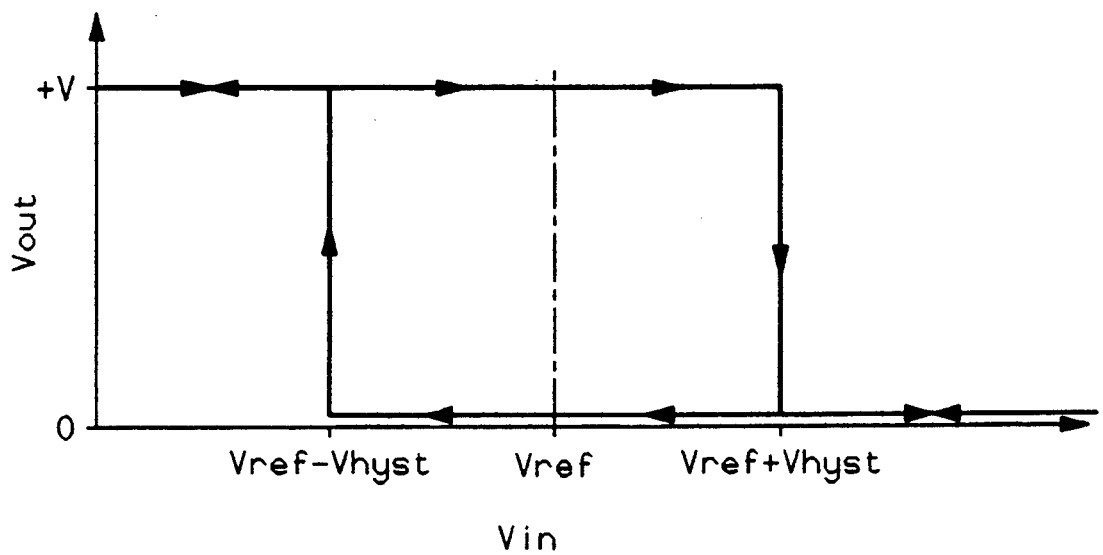
FIG. 1 is a graph depicting an idealized hysteresis characteristic for a comparator circuit.
Figure 2:
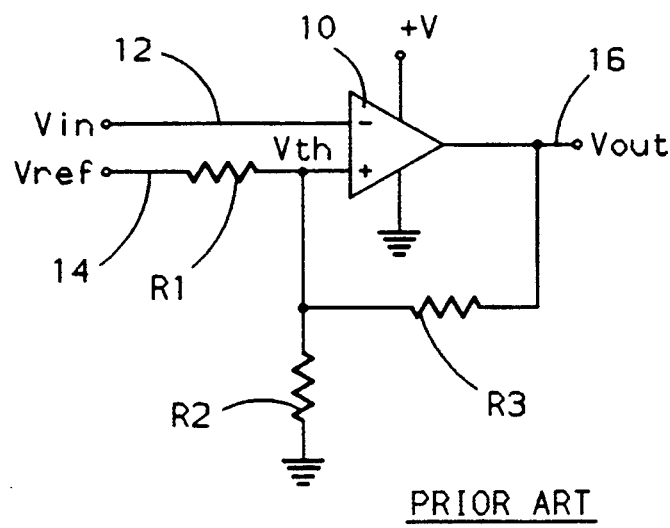
FIG. 2 is a discrete prior art hysteresis comparator circuit for achieving a hysteresis characteristic of the type depicted in FIG. 1.
Figure 3:
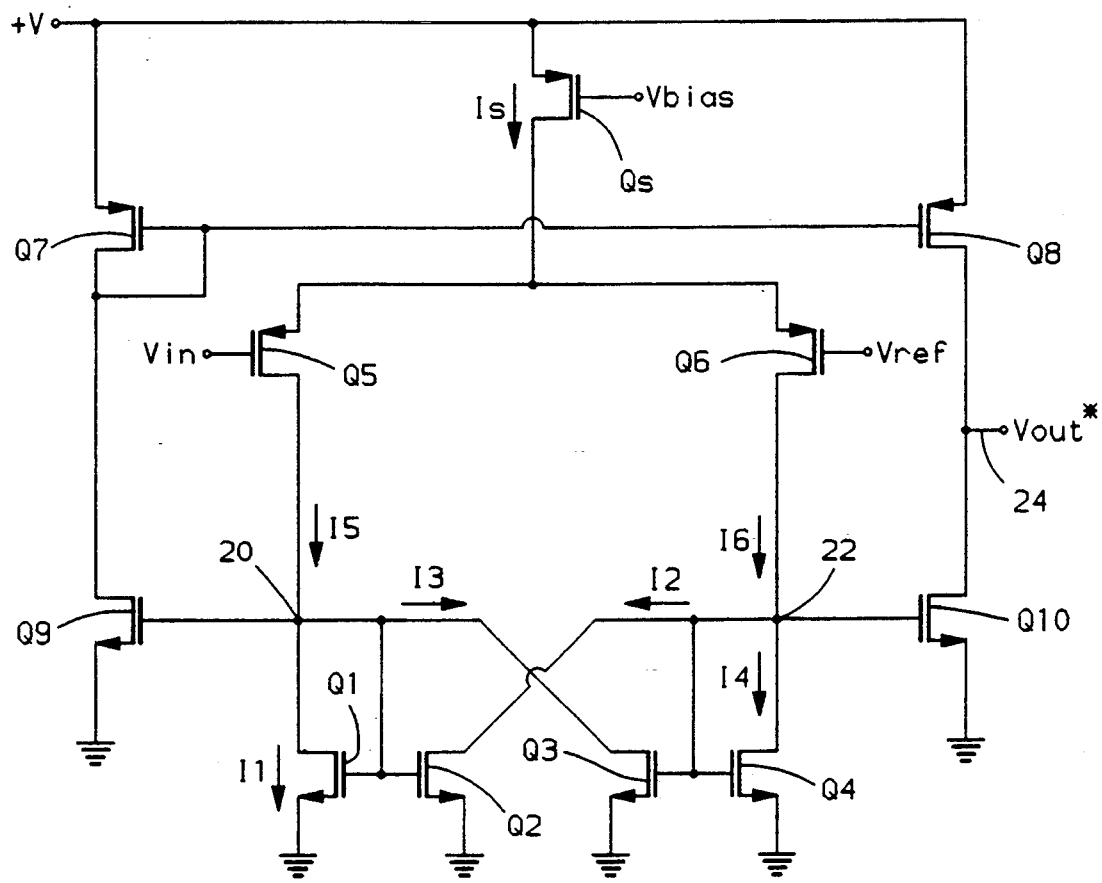
FIG. 3 is a prior art MOS hysteresis comparator circuit for achieving a hysteresis characteristic of the type depicted in FIG. 1.

As indicated above in reference to the MOS comparator of FIG. 3, a first switch point of the comparator occurs when the input voltage Vin rises above the reference voltage Vref by at least Vhyst. At this switch point, the comparator has a primary switch point current (I5) through transistors Q5 and Q1, and a secondary switch point current, equal to the hysteresis current I2(h), through differential transistor Q6 and the hysteresis transistor Q2.

A second switch point occurs when Vin falls below Vref by at least Vhyst. At this switch point, the comparator has a primary switch point current (I6) through the transistors Q6 and Q4, and a secondary switch point current, equal to hysteresis current I3(h), through differential transistor Q5 and the hysteresis transistor Q3. At either switch point, the sum of the primary and secondary switch point currents is the same due to dimensional matching of differential transistors QS, Q6, load transistors Q1, Q4, and the hysteresis transistors Q2, Q3.

The switch point currents of the comparator are replicated in the bias circuit 30 by a left circuit leg comprising the transistors Q13 and Q14, and a right circuit leg comprising the transistors Q15 and Q16. Both lower transistors Q14 and Q16 are dimensionally matched with the differential transistors Q5 and Q6, and the combination of Vref and a Vhyst voltage source 34 enforces a gate voltage differential therebetween which is identical in magnitude to the differential (Vin−Vref) which occurs at the switch points of the comparator. Finally, the W/L ratio of upper transistors Q13 and Q15 is identical to the ratio of the comparator transistors Q2 and Q1 (or Q3 and Q4). Expressed algebraically:

$$W14/L14 = W16/L16 = W5/L5 = W6/L6, \text{ and}$$

$$(W13/L13)/(W15/L15) = (W2/L2)/(W1/L1) = (W3/L3)/(W4/L4)$$

Consequently, the right circuit leg of bias circuit 30 will conduct a current equal to the primary switch point current of the comparator, and the left circuit leg of bias circuit 30 will conduct a current equal to the secondary (hysteresis) switch point current of the comparator.

The condition of Vhyst=ΔVon is enforced in the source transistor bias circuit 30 of FIG. 5 by the operational amplifier 32, which provides a bias voltage Vbias for upper transistors Q13 and Q15. The non-inverting input (+) of operational amplifier 32 is connected to the source of transistor Q14 at junction 36, and the inverting input (−) is connected to the source of transistor Q16 at junction 38. Any voltage difference between junctions 36 and 38 results in the generation of a bias voltage Vbias which opposes the difference. For example, if the voltage at junction 36 rises above the voltage at junction 38, the bias voltage Vbias becomes more positive, sourcing less current through upper transistors Q13 and Q15. However, since (W13/L13) is greater than (W15/L15), the right leg current is decreased more than the left leg current, eliminating the sensed voltage difference. On the other hand, if the voltage at junction 38 rises above the voltage at junction 36, the bias voltage Vbias becomes more negative, sourcing more current through upper transistors Q13 and Q15. However, since (W13/L13) is greater than (W15/L15), the right leg current is increased less than the left leg current, again eliminating the sensed voltage difference.

These voltage imbalances occur due to variations in the transistor gain constants K14, K16 with temperature and manufacturing process variations. For example, a temperature variation of −40° C. to +150° C. produces approximately 50% variation in the transistor gain constants. Process variations, due to variations in oxide thickness or doping profiles, for example, may cause an additional 30% variation in the transistor gain constants. For any such variation, the effects observed in bias circuit 30 are identical to those observed in the comparator circuit of FIG. 3.

The source transistor Qs, also biased by the output bias voltage Vbias of operational amplifier 32, is dimensionally sized relative to the transistors Q13 and Q15 to mirror a source current Is equal to the sum of the currents sourced by transistors Q13 and Q15. The source transistor Qs has a current path length Ls identical to transistors Q13 and Q15, and a current path width Ws equal to the sum of the current path widths of upper transistors Q13 and Q15. Expressed algebraically:

$$Ws = W13 + W15 \text{ and } Ls = L13 = L15$$

Consequently, the sum of the currents through transistors Q13 and Q15 is mirrored through source transistor Qs.

Since the bias circuit 30 replicates the primary and secondary switch point comparator currents which occur at a constant hysteresis voltage Vhyst, and the source transistor Qs of the comparator is sized to mirror the sum of the replicated currents, the comparator will also have a constant hysteresis voltage Vhyst, despite temperature and manufacturing process variations.

A reset transistor Qr connected in parallel with transistor Q15 is toggled on power-up as indicated by the gate voltage waveform 40 to ensure that junction 38 is initially at a higher potential than junction 36. This initiates the supply of current through transistors Q13 and Q15 to provide consistent and repeatable operation at start-up.

Figure 6:
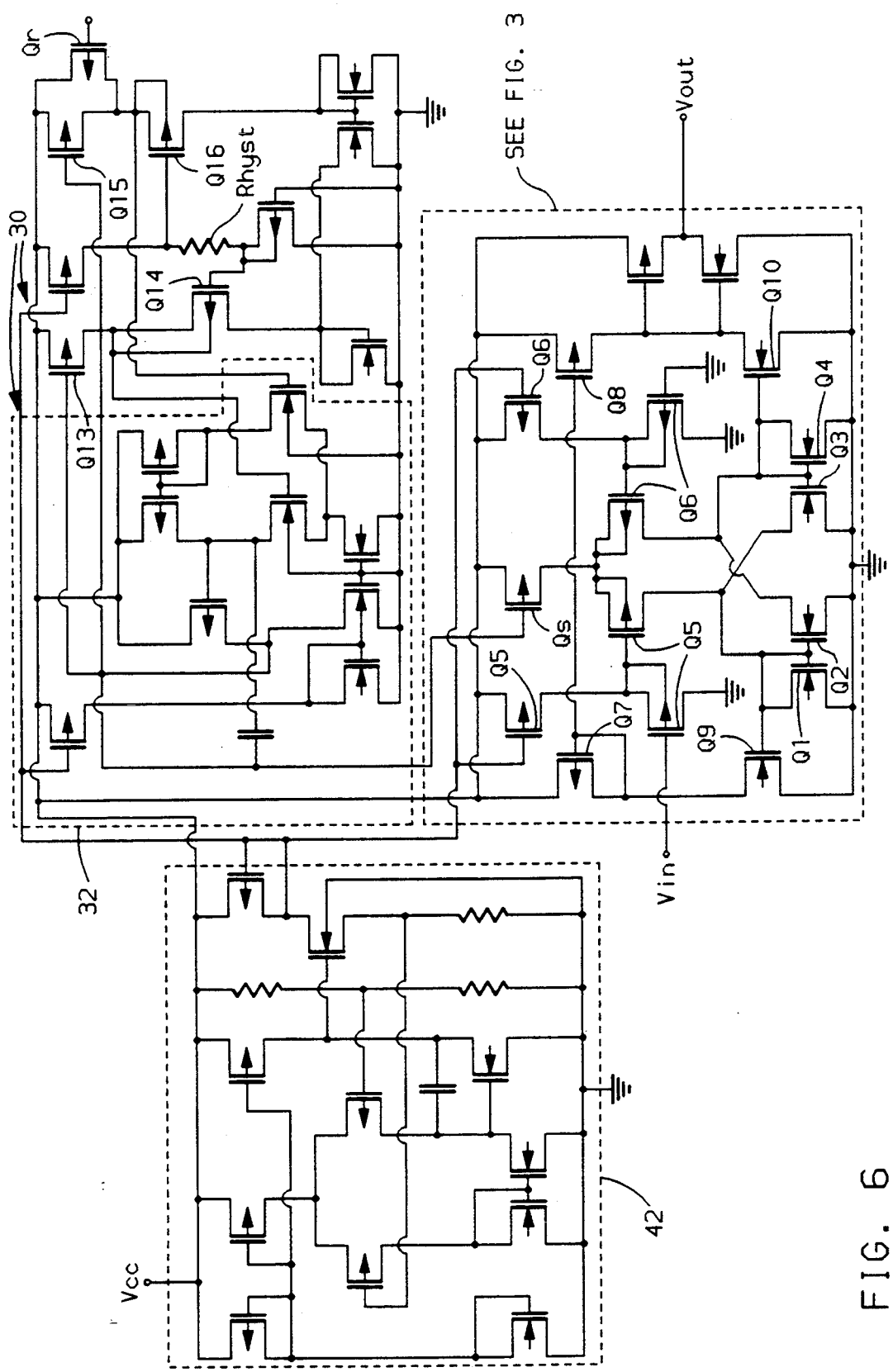
FIG. 6 is a circuit diagram of a MOS hysteresis comparator incorporating the source transistor bias circuit of this invention.

An actual circuit mechanization of a hysteresis comparator incorporating the source transistor bias circuit of this invention is depicted in FIG. 6, where circuit blocks corresponding to the discrete elements depicted in FIGS. 3 and 5 are similarly identified. The voltage source 34 is defined by the voltage across the resistor Rhyst, the current through Rhyst being established by the current source circuit 42. Operation of the depicted circuitry at the component level will be appreciated by persons skilled in the art and is not discussed in detail herein.

In testing of the subject mechanization over temperature and manufacturing process variation, the hysteresis was maintained relatively constant, within approximately 7% of the nominal hysteresis voltage.

While this invention has been described in reference to the illustrated embodiment, it is expected that various modifications will occur to those skilled in the art. For example, the offset voltage could be implemented with different circuitry and complementary transistor configurations could be employed. In this regard, it will be understood that circuits incorporating such modifications may fall within the scope of this invention, which is defined by the appended claims.

The embodiments of the invention in which an exclusive property or privilege is claimed are defined as follows:

1. A MOS transistor comparator for comparing an input voltage Vin to a reference voltage Vref, comprising:
    first and second circuit legs defined by first and second serially connected differential and load transistors, the first and second differential transistors being coupled to a current source for conducting first and second differential currents based on input voltage Vin and reference voltage Vref, respectively;
    means for developing an output voltage Vout based upon voltages developed across said first and second load transistors;
    hysteresis means including alternately activated hysteresis transistors cross-coupled between said first and second circuit legs of the comparator for diverting differential current from a load transistor of one leg up to a hysteresis current having a predetermined relationship to the differential current in the other leg, thereby to establish switch points of said output voltage when input voltage Vin varies from reference voltage Vref by a hysteresis voltage Vhyst whereat the differential current in such one leg exceeds said hysteresis current;
    bias circuit means for producing first and second bias currents, respectively, which replicate the differential currents conducted by said first and second differential transistors at the switch points of said output voltage when the output voltage is at a desired hysteresis value; and
    output means, coupled to the bias circuit means, for controlling said current source the supply current to said first and second legs of said comparator in accordance with the sum of the first and second bias currents produced by said bias circuit means.

2. The comparator of claim 1, wherein the bias circuit means includes first and second MOS transistors having current path dimensions matched, respectively, to the first and second differential transistors, and third and fourth MOS transistors having a ratio of current path dimensions matched to that of one of the load transistors and one of the hysteresis transistors.

3. The comparator of claim 1, wherein the bias circuit comprises:
    a first circuit defined by first and second bias transistors for conducting said first bias current;
    a second circuit defined by third and fourth bias transistors for conducting said second bias current, wherein said first and third bias transistors have current path dimensions matched to the first and second differential transistors, respectively, and the second and fourth bias transistors have a ratio current path dimensions matched with that of one of the load and one of the hysteresis transistors, respectively;
    voltage source means for establishing a fixed gate voltage differential equivalent to said desired hysteresis voltage between said first and third bias transistors; and
    current regulating means for controlling said first and second bias current so as to replicate the coupling of said first and second differential transistors in said bias circuit.

4. The comparator of claim 3, wherein said voltage source means comprises a voltage source corresponding to said desired hysteresis voltage, offset by a voltage corresponding to said reference voltage Vref.

5. The comparator of claim 3, wherein said first and second differential transistors are coupled at source terminals thereof, and wherein the current regulating means comprises an operational amplifier having inverting and non-inverting inputs coupled respectively to source terminals of said first and third bias transistors for developing a common control voltage output coupled to the gates of said second and fourth bias transistors which substantially eliminates a voltage differential between the source terminals of said first and third bias transistors.

6. The comparator of claim 5, wherein the bias circuit includes reset means for temporarily establishing a voltage differential between source terminals of said first and third bias transistors, of a polarity which causes said operational amplifier to increase said first and second bias currents.

7. The comparator of claim 5, wherein said current source includes a source transistor coupled to said first and second differential transistors and having a gate terminal controlled by said control voltage output by said operational amplifier, and having a current path dimension determined relative to current path dimensions of said second and fourth bias transistors so as to supply current in accordance with the sum of said first and second bias currents.

8. A current supply circuit for a MOS transistor comparator circuit, the comparator circuit comparing an input voltage Vin and a reference voltage Vref, and having a primary current path for conducting a primary current portion of a supply current and a secondary current path for conducting a secondary portion of the supply current, the secondary current portion having a predetermined relationship to the primary current portion at a switch point of the comparator whereat Vin varies from Vref by a hysteresis voltage, the current supply circuit comprising:

bias circuit means for generating first and second reference currents, respectively, having values replicating the primary and secondary current portions supply current at the switch point of the comparator when the hysteresis voltage is at a desired hysteresis value; and means, coupled to the bias circuit, for supplying the supply current to the comparator circuit at a value substantially equal to the sum of the first and second reference currents.

9. The current supply circuit of claim 8, wherein said bias circuit means comprises:

a first circuit path having a first pair of bias transistors with current path dimensions corresponding to transistors defining said primary current path of said comparator for conducting said first reference current; and a second circuit path having a second pair of bias transistors with current path dimensions corresponding to transistors defining said secondary current path of said comparator for conducting said second reference current.

10. The current supply circuit of claim 8, wherein said first and second reference currents are established by first and second bias transistors in accordance with a bias voltage, and said supply current is supplied by a source transistor in accordance with said bias voltage, the source transistor having a current path dimension determined relative to current path dimensions of said first and second bias transistors such that the supply current is substantially equal to the sum of said first and second reference currents.

* * * * *